United States Patent
Kang

(10) Patent No.: US 7,843,677 B2
(45) Date of Patent: Nov. 30, 2010

(54) ELECTRONIC DEVICE AND METHOD FOR REMOVING STATIC ELECTRICITY

(75) Inventor: Ho-woong Kang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 12/026,036

(22) Filed: Feb. 5, 2008

(65) Prior Publication Data

US 2009/0080134 A1 Mar. 26, 2009

(30) Foreign Application Priority Data

Sep. 20, 2007 (KR) .................... 10-2007-0095885

(51) Int. Cl.
*H02H 9/00* (2006.01)
(52) U.S. Cl. ........................ 361/212; 361/56
(58) Field of Classification Search .............. 361/56, 361/212, 220
See application file for complete search history.

(56) References Cited

U.S. PATENT DOCUMENTS 5,389,952 A * 2/1995 Kikinis ...................... 345/212
2002/0034192 A1* 3/2002 Kim ........................... 370/466
2004/0221183 A1 11/2004 Lu
2007/0152994 A1* 7/2007 Koh ........................... 345/211
2007/0217101 A1* 9/2007 Carter et al. .................. 361/54
2009/0225062 A1* 9/2009 Naik et al. .................. 345/204

* cited by examiner

*Primary Examiner*—Danny Nguyen
(74) *Attorney, Agent, or Firm*—Sughrue Mion, PLLC

(57) ABSTRACT

An electronic device and a method for removing a static electricity thereof are provided. The method for removing a static electricity includes performing a switching operation to transmit a signal output from an interface, which is communicably connected to an external device, to a signal processor or cut off the signal from being transmitted to the signal processor, and based on this switching operation, performing a switching operation to supply a bias power to the signal processor or cut off a supply of power to the signal processor. Accordingly, a static electricity signal is grounded using a switch based on an operation state of the electronic device such that a static electricity shock and static electricity noise can be prevented from affecting the electronic device.

25 Claims, 3 Drawing Sheets

ELECTRONIC DEVICE AND METHOD FOR REMOVING STATIC ELECTRICITY

CROSS-REFERENCE TO RELATED APPLICATIONS

This application claims priority from Korean Patent Application No. 10-2007-95885, filed on Sep. 20, 2007, in the Korean Intellectual Property Office, the disclosure of which is incorporated herein by reference in its entirety.

BACKGROUND OF THE INVENTION

1. Field of the Invention

Methods and apparatuses consistent with the present invention relate to an electronic device and a method for removing a static electricity thereof, and more particularly, to an electronic device which prevents a static electricity shock and a static electricity noise from affecting the device by using a switch, and a method for removing a static electricity thereof.

2. Description of the Related Art

An electronic device, such as a digital television, a set-top box, a projector, a digital camcorder, and an audio/video (A/V) device, may be connectable to an external device in a wire/wireless manner.

In particular, with respect to an electronic device connected to an external device via wire such as a cable, when a user connects the external device to a cable port provided on the electronic device, a static electricity occurs. The static electricity has a small amount of electric charge and thus generally does not harm the user. However, the static electricity has a very high voltage characteristic and thus may short-circuit some elements of the electronic device thereby causing a malfunction of the electronic device. That is, the static electricity short-circuits the electronic device, which is called "static electricity shock", and the static electricity causes a malfunction such as noise to a display of the electronic device, which is called "static electricity noise".

A related art electronic device employs a static electricity removing circuit for preventing a static electricity shock from affecting the electronic device. However, this circuit cannot remove a static electricity noise and thus a malfunction such as noise still occurs in a display of the electronic device. Therefore, there has been a demand for solving a static electricity noise in addition to a static electricity shock.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

According to an aspect of the present invention, there is provided a method for removing a static electricity, including performing a first switching operation to transmit a signal output from an interface, which is communicably connected to an external device, to a signal processor or cut off the signal from being transmitted to the signal processor, and based on a switching state at the first switching operation, performing a second switching operation to supply a power to the signal processor or cut off a supply of power to the signal processor.

If the first switching operation is performed to transmit a signal output from the interface to the signal processor, the second switching operation may be performed to supply a power to the signal processor.

If the first switching operation is performed to cut off a signal output from the interface from being transmitted to the signal processor, the second switching operation may be performed to cut off a supply of power to the signal processor.

The signal output from the interface may be at least one of a static electricity signal which is generated if there is a connection to the external device and an image signal which is input from the external device. The first switching operation may be performed to connect the static electricity signal output from the interface to ground and transmit the image signal to the signal processor.

The static electricity signal may include a static electricity shock and a static electricity noise.

The first switching operation may be performed based on a determination as to whether the image signal is input to the signal processor or not as a result of detecting a synchronization signal included in the image signal output from the interface.

According to another aspect of the present invention, there is provided an electronic device which displays an image signal, including an interface which is communicably connected to an external device, a signal processor which performs a signal-processing with respect an image signal input from the external device through the interface, a first switching element which performs a switching operation to transmit a signal output from the interface to the signal processor or cut off the signal from being transmitted to the signal processor, and a controller which controls the first switching element based on an operation state of the electronic device.

The operation state of the electronic device may include at least one of a state concerning whether the external device is connected to the interface or not, a power-on state of the electronic device, and a power-off state of the electronic device.

The controller may control the first switching element to connect a signal output from the interface to ground and cut off a signal output from the interface from being transmitted to the signal processor.

The interface may output at least one of a static electricity signal which is generated if there is a connection to the external device and an image signal which is input from the external device. The controller may control the first switching element to connect the static electricity signal output from the interface to ground and transmit the image signal to the signal processor.

The static electricity signal may include a static electricity shock and a static electricity noise.

The electronic device may further include a second switching element which supplies a bias power to the signal processor or cuts off a supply of bias power to the signal processor. The controller may control the second switching element based on a switching state of the first switching element.

If the first switching element performs a switching operation to transmit a signal output from the interface to the signal processor, the controller may control the second switching element to supply a bias power to the signal processor.

If the first switching element performs a switching operation to cut off a signal output from the interface from being transmitted to the signal processor, the controller may control the second switching element to cut off a supply of bias power to the signal processor. The controller may determine whether the image signal is input to the signal processor or not by detecting a synchronization signal included in the image signal output through the interface, and based on a result of determination, controls the second switching element.

The interface may output a "LOW" reference voltage if there is a connection to the external device, and may outputs a "HIGH" reference voltage if there is no connection to the external device. The controller may determine whether the external device is connected to the interface based on a state of the reference voltage output from the interface.

The electronic device may be a digital television.

According to another aspect of the present invention, there is provided a method for removing a static electricity, including determining whether an interface, which is communicably connectable to an external device, is connected to the external device or not, and based on whether there is a connection to the external device, performing a first switching operation to transmit a signal output from the interface to a signal processor or cut off the signal from being transmitted to the signal processor.

The first switching operation may be performed to connect a signal output from the interface to ground and cut off a signal output from the interface from being transmitted to the signal processor.

The signal output from the interface may be at least one of a static electricity signal which is generated if there is a connection to the external device and an image signal which is input from the external device. The first switching operation may be performed to connect the static electricity signal output from the interface to ground and transmit the image signal to the signal processor.

The method may further include, based on a switching state at the first switching operation, performing a second switching operation to supply a bias power to the signal processor or cut off a supply of bias power to the signal processor.

If the first switching operation is performed to cut off a signal output from the interface from being transmitted to the signal processor, the second switching operation may be performed to cut off a supply of bias power to the signal processor. If the first switching operation is performed to transmit a signal output from the interface to the signal processor, the second switching step may be performed to supply a bias power the signal processor.

According to still another aspect of the present invention, there is provided an electronic device, including an interface which is communicably connected to an external device, a signal processor which performs a signal processing with respect to an image signal input from the external device through the interface, a first switching element which performs a switching operation to transmit a signal output from the interface to the signal processor or cut off the signal from being transmitted to the signal processor, a second switching element which performs a switching operation to supply a power to the signal processor or cut off a supply of power to the signal processor, and a controller which controls the second switching element based on a switching state of the first switching element.

If the first switching element performs a switching operation to transmit a signal output from the interface to the signal processor, the controller may control the second switching element to supply a power to the signal processor.

If the first switching element performs a switching operation to cut off a signal output from the interface from being transmitted to the signal processor, the controller may control the second switching element to cut off a supply of power to the signal processor.

The interface may output at least one of a static electricity signal which is generated if there is a connection to the external device and an image signal which is input from the external device. The controller may control the first switching element to connect the static electricity output from the interface to ground and transmit the image signal to the signal processor.

BRIEF DESCRIPTION OF THE DRAWINGS

Above and other aspects of the present invention will become apparent and more readily appreciated from the following description of the exemplary embodiments, taken in conjunction with the accompany drawings of which.

DETAILED DESCRIPTION OF EXEMPLARY EMBODIMENTS

Certain exemplary embodiments of the present invention will be described in greater detail with reference to the accompanying drawings.

Figure 1:
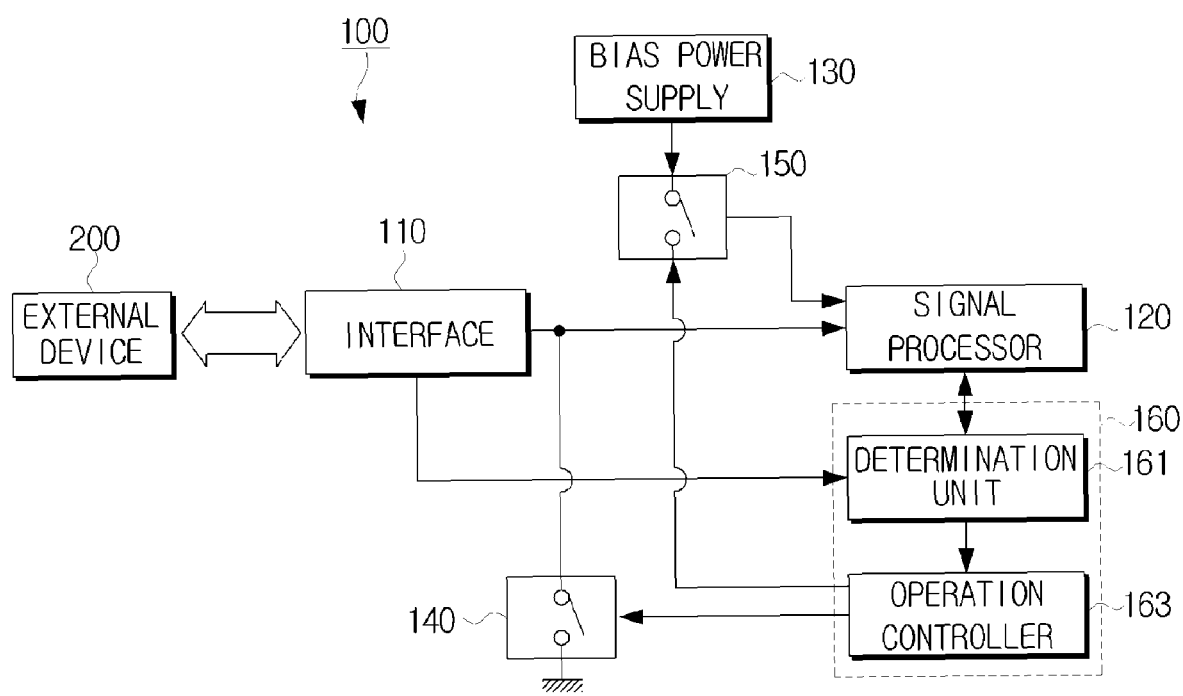
FIG. 1 is a block diagram illustrating an electronic device according to an exemplary embodiment of the present invention.

FIG. 1 is a block diagram illustrating an electronic device according to an exemplary embodiment of the present invention.

Referring to FIG. 1, an electronic device 100 according to an exemplary embodiment of the present invention comprises an interface 110, a signal processor 120, a bias power supply 130, a first switching unit 140, a second switching unit 150, a controller 160, and a display 170.

The interface 110 connects the electronic device 100 to an external device 200 and has a port for connecting to the external device 200. The electronic device 100 may be connected to the external device 20 using a cable connected through the interface 100, but this should not be considered as limiting. The electronic device 100 may be connected to the external device 200 in a wireless manner without using the cable.

The signal processor 120 performs a signal processing such as video decoding, video scaling, and audio decoding with respect to a video signal of an output signal output from the interface 100, and outputs the signal-processed video signal to the display 170.

The signal processor 120 outputs an audio signal of the output signal output from the interface 110 through a speaker (not shown). Herein, the output signal includes an image signal, a data signal, and a static electricity signal, and the image signal includes an audio signal and a video signal. The static electricity signal includes a static electricity shock which causes a short-circuit to the electronic device and static electricity noise which causes noise in a display of the electronic device.

The bias power supply 130 supplies a bias power to the signal processor 120.

The first switching unit 140 is controlled by the controller 160, which will be described below, to connect the output signal output from the interface 110 to ground or to output the output signal to the signal processor 120. That is, the first switching unit 140 is controlled by the controller 160 to connect the static electricity signal to ground and output the video signal, the audio signal, and the data signal output from the interface 110 to the signal processor 120.

The second switching unit 150 is controlled by the controller 160 to supply the bias power output from the bias power supply 130 to the signal processor 120 or cut off a supply of bias power to the signal processor 120.

The controller 160 comprises a determination unit 161 and an operation controller 163. The controller 160 determines whether a cable (not shown) is connected to the interface 110, determines whether a signal is input to the signal processor 120, and controls the first and the second switching units 140, 150 according to the determination results.

The determination unit 161 determines whether a cable is connected to the interface 110, and monitors the signal processor 120 at predetermined periods and determines whether an output signal output from the interface 110 is input to the signal processor 120.

More specifically, the determination unit 161 determines whether there is a connection to a cable based on a voltage control signal received from the interface 110. That is, if a cable is connected to the interface 110, the determination unit 161 receives a voltage control signal having a "LOW" reference voltage from the interface 110, and if a cable is not connected to the interface 100, the determination unit 161 receives a voltage control signal having a "HIGH" reference voltage. In another exemplary embodiment, if a reference voltage included in the voltage control signal is "HIGH", it is determined that a cable is connected to the interface 110, and if a reference voltage is "LOW", it is determined that a cable is not connected to the interface 110.

Also, the determination unit 161 detects a synchronization signal from the output signal output from the interface 110, and determines whether the output signal is input to the signal processor 120 or not based on the detected synchronization signal.

More specifically, if the output signal includes a synchronization signal, the determination unit 161 determines that the output signal is input to the signal processor 120, and if no synchronization signal is included in the output signal, the determination unit 161 determines that the output signal is not input to the signal processor 120.

If the determination unit 161 determines that a cable (not shown) is connected to the interface 110 and that an output signal output from the interface 110 is not input to the signal processor 120, the operation controller 163 controls the first switching unit 140 to switch on and the second switching unit 150 to switch off.

That is, the operation controller 163 switches on the first switching unit 140 to connect the output signal output from the interface 110 to ground, and switches off the second switching unit 150 to prevent a bias power from being supplied from the bias power supply 130 to the signal processor 120.

If the determination unit 161 determines that a cable is connected to the interface 110 and that the output signal output from the interface 110 is input to the signal processor 120, the operation controller 163 controls the first switching unit 140 to switch off and the second switching unit 150 to switch on.

That is, the operation controller 163 switches off the first switching unit 140 to allow a video signal and an audio signal output from the interface 110 to be input to the signal processor 120, and switches on the second switching unit 150 to supply a bias power from the bias power supply 130 to the signal processor 120, thereby preventing a short-circuit of the bias power supply 130.

Figure 2:
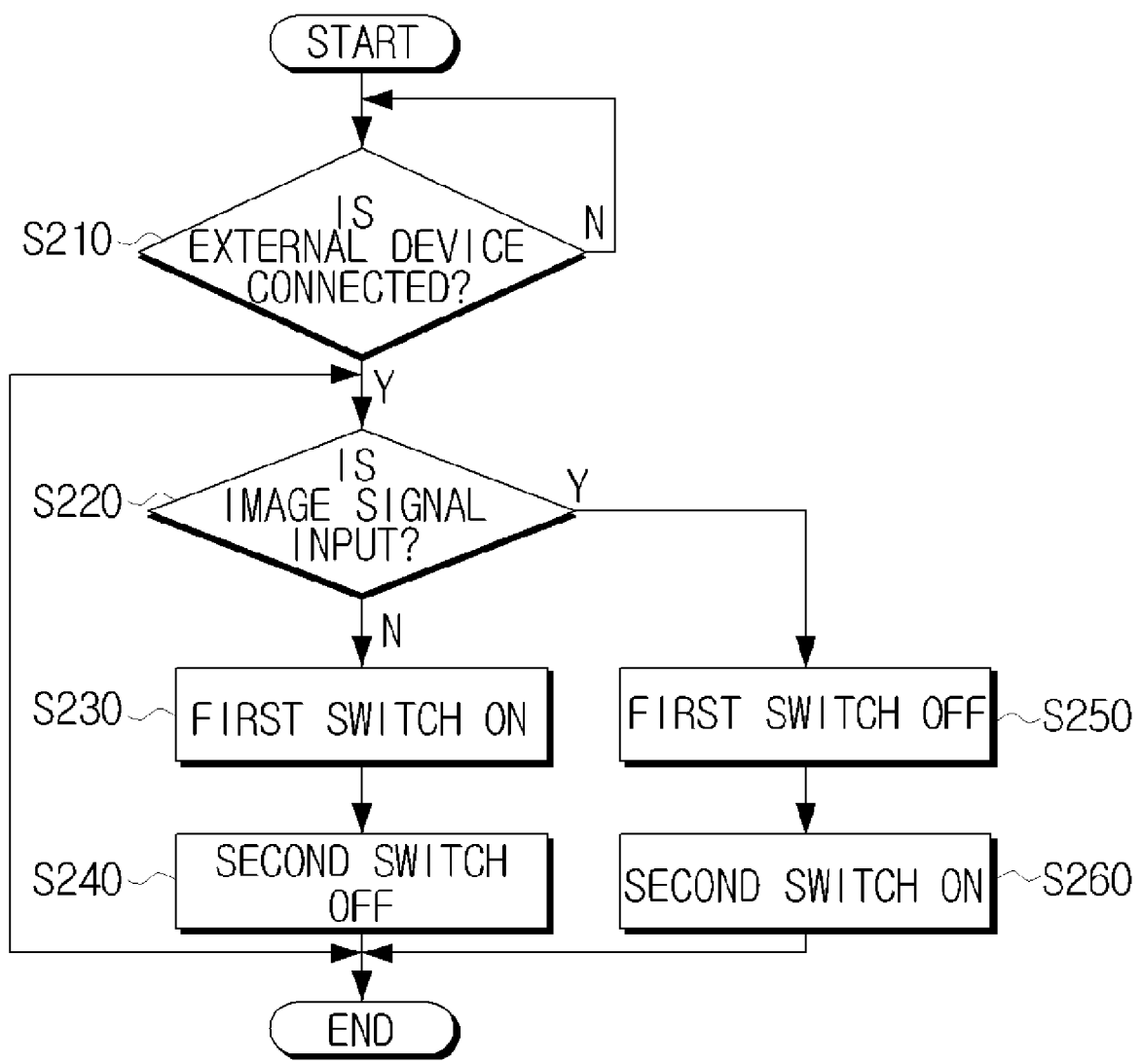
FIG. 2 is a flowchart illustrating a method for operating an electronic device according to an exemplary embodiment of the present invention.

FIG. 2 is a flowchart illustrating a method for operating an electronic device according to an exemplary embodiment of the present invention.

Referring to FIG. 2, the determination unit 161 determines whether an external device is connected to the electronic device 100 through a cable (S210).

More specifically, the interface 110 normally maintains a pre-set constant reference voltage, and if a cable is connected, the reference voltage decreases to 0 V. The interface 110 outputs a voltage control signal including a state of the reference voltage, and the determination unit 161 determines whether the external device is connected to the electronic device 100 based on a "HIGH" or "LOW" state of the reference voltage included in the voltage control signal.

That is, if the reference voltage included in the voltage control signal is "LOW", the determination unit 161 determines that a cable is connected to the electronic device 100, and if the reference voltage is "HIGH", the determination unit 161 determines that a cable is not connected to the electronic device 100. In other exemplary embodiment, inversely, a "HIGH" reference voltage represents that a cable is connected to the interface 110 and a "LOW" reference voltage represents that a cable is not connected to the interface 110.

If it is determined that an external device is connected (S210: Y), the determination unit 161 determines whether an image signal output from the interface 110 is input to the signal processor 120 (S220).

More specifically, the determination unit 161 detects a synchronization signal from the image signal output from the interface 110. If a synchronization signal is detected from the image signal, the determination unit 161 determines that the image signal is input to the signal processor 120, and if no synchronization signal is detected from the image signal, the determination unit 161 determines that the image signal is not input to the signal processor 120. That is, the determination unit 161 detects a synchronization signal from the image signal, and determines whether the image signal is input to the signal processor 120 or not based on whether the image signal includes a synchronization signal.

If it is determined that the image signal is not input (S220: N), the operation controller 163 switches on the first switching unit 140 to connect the output signal to ground (S230).

More specifically, if it is determined that the image signal is not input to the signal processor 120 (S220: N), the operation controller 163 switches on the first switching unit 140 to connect a static electricity signal output from the interface 110 to ground (SW230). Herein, the static electricity signal includes a static electricity shock which causes a short-circuit to the electronic device and static electricity noise which causes noise in a display of the electronic device.

Next, the operation controller 163 switches off the second switching unit 150 to cut off a supply of bias power (S240). That is, the operation controller 163 switches off the second switching unit 150 to prevent a bias power output by the bias power supply 140 from being supplied to the signal processor 120.

After the operation of switching off the second switch 150, the operation controller 163 returns to operation S220 and continues to monitor whether an image signal is input to the signal processor 120.

At operation S220, if it is determined that an image signal is input to the signal processor 120 (S220: Y), the operation controller 163 switches off the first switching unit 140 (operation S250).

Next, the operation controller 163 switches on the second switching unit 150 (S260). That is, the operation controller 163 switches on the second switching unit 150 to supply a bias power from the bias power supply 130 to the signal processor 120.

In this exemplary embodiment, the operation controller 163 continues to monitor whether an image signal is input to the signal processor 120 at operation S220. However, this should not be considered as limiting. If a predetermined time lapses after the first switching unit 140 switches on and the second switching unit 150 switches off at operations S230 and S240, the operation controller 163 switches off the first switching unit 140 and switches on the second switching unit 150.

Also, in this exemplary embodiment, if an external device is connected to the electronic device 100 and if an output signal is not input to the signal processor 120, the controller 160 switches on the first switching unit 140 and switches off the second switching unit 150. However, this should not be considered as limiting. If an external device is connected to the electronic device 100, the controller 160 switches on the first switching unit 140 and switches off the second switching unit 150 regardless of whether an output signal is input to the signal processor 120. This will be described below with reference to FIG. 3.

Figure 3:
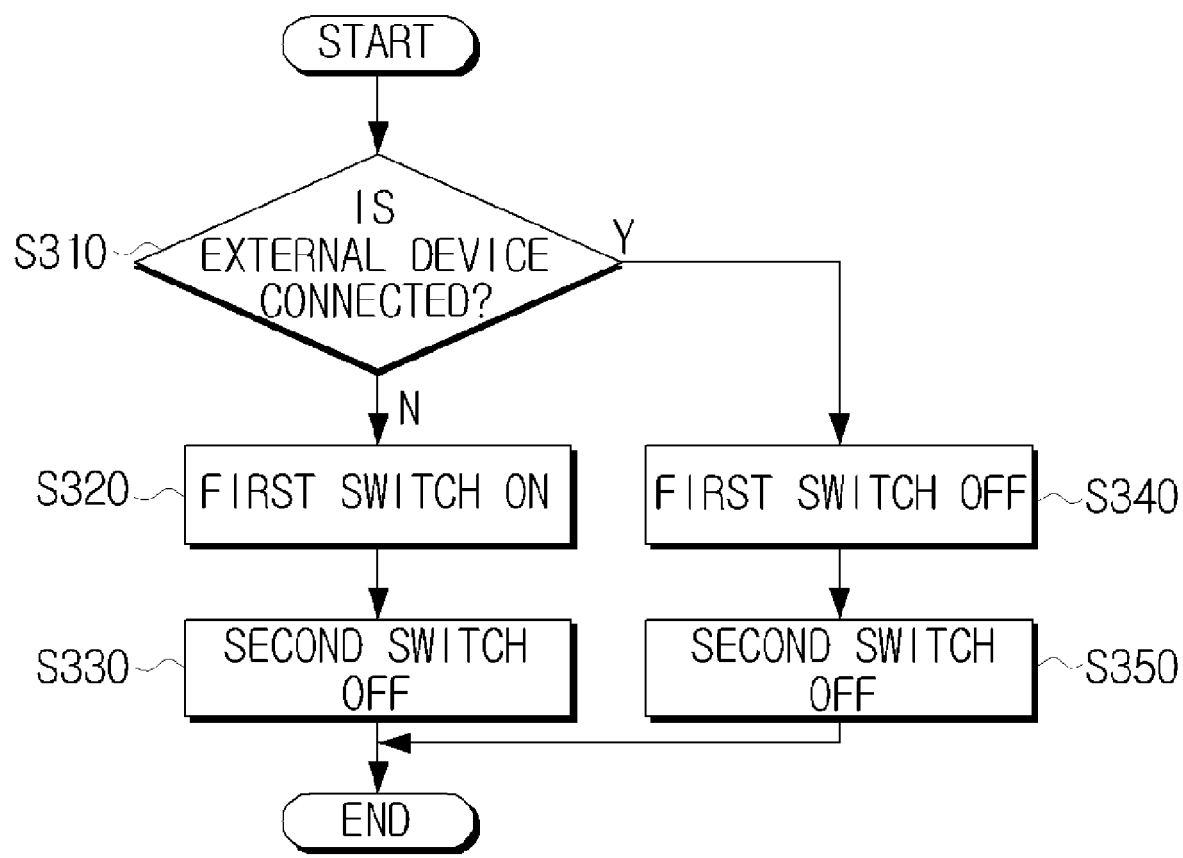
FIG. 3 is a flowchart illustrating a method for operating an electronic device according to another exemplary embodiment of the present invention.

FIG. 3 is a flowchart illustrating a method for operating an electronic device according to another exemplary embodiment of the present invention.

Referring to FIG. 3, the determination unit 161 determines whether an external device is connected to the electronic device 100 through a cable (S310). The process for determining whether an external device is connected to the electronic device 100 has been described above, and thus descriptions thereof will be omitted.

If it is determined that an external device is not connected to the electronic device 100 (S310: N), the operation controller 163 controls the first switching unit 140 to connect a signal output from the interface 110 to ground (S320). That is, the operation controller 163 switches on the first switching unit 140 to connect a static electricity signal output from the interface 110 to ground.

Also, the operation controller 163 controls the second switching unit 150 to cut off a supply of bias power to the signal processor 120 (S330). That is, the operation controller 163 switches off the second switching unit 150 to prevent a bias power output from the bias power supply 130 from being supplied to the signal processor 120.

If it is determined that an external device is connected to the electronic device 100 (S310: Y), the operation controller 163 controls the first switching unit 140 to allow a signal output from the interface 110 to the signal processor 120 (S340). That is, the operation controller 163 switches off the first switching unit 140 to allow an image signal input from the external device 200 through the interface 110 to be transmitted to the signal processor 120. Since an initial switching state of the first switching unit 140 is set to connect a signal output from the interface 110 to ground, a static electricity signal output from the interface 110 has been already grounded and removed before the image signal is transmitted to the signal processor 120.

Next, the operation controller 163 controls the second switching unit 150 to supply a bias power to the signal processor 120 (S350). That is, the operation controller 163 switches on the second switching unit 150 to supply a bias power from the bias power supply 130 to the signal processor 120.

Also, according to an exemplary embodiment of the present invention, if the electronic device 100 is disconnected from the external device 200 which has been previously connected thereto through a cable, i.e., if a cable is released from the connection to the electronic device 100, the controller 160 switches on the first switching unit 140 and switches off the second switching unit 150 such that the output signal output from the interface 110 is grounded.

Also, the static electricity removing circuit according to the exemplary embodiment of the present invention may be applicable to various electronic apparatuses. The electronic apparatuses, to which the present invention is applicable, include a set top box (STB), a digital multimedia broadcasting (DMB) receiving apparatus, a home theater, a digital video disk (DVD) player, a personal computer (PC), a television (TV), and various portable devices having a broadcast receiving function (for example, a mobile phone, a navigation device, and a personal multimedia player).

In this exemplary embodiment, the switching operations of the first and the second switching units 140 and 150 are controlled based on whether an external device is connected to the electronic device 100. However, this should not be considered as limiting. The switching operation of the first and the second switching units 140 and 150 may be controlled if a power is supplied to the electronic device 100 or a power supply is cut off. That is, the controller 160 controls the first switching unit 140 to connect a static electricity signal, which occurs at the time of power on/off operation of the electronic device 100, to ground, and based on a switching state of the first switching unit 140, the controller 160 controls the second switching unit 150.

Also, in this exemplary embodiment, an image signal output from the interface 110 includes a synchronization signal. However, this should not be considered as limiting. A synchronization signal may be input through a different signal line from that of an image signal. In this case, the controller controls the first switching unit 140 to connect a static electricity signal to ground at the initial stage, and if a synchronization signal input to the signal processor 120 is detected, the controller controls the first switching unit 140 to be released from a connection to ground and controls the second switching unit 150 to supply a bias power to the signal processor 120. That is, even if an external is not connected to the electronic device 100, the controller 160 can detect whether a synchronization signal is input to the signal processor 120 and accordingly control the first and the second switching units 140 and 150.

As described above, according to the exemplary embodiments of the present invention, the static electricity signal is grounded using switching units, and thus, the electronic device 100 can be prevented from being affected by a static electricity shock and static electricity noise.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method for removing a static electricity, the method comprising:
    performing a first switching operation to transmit a signal output from an interface, which is communicably connected to an external device, to a signal processor or prevent the signal from being transmitted to the signal processor; and
    based on a switching state at the first switching operation, performing a second switching operation to supply power to the signal processor or prevent supply of power to the signal processor.

2. The method as claimed in claim 1, wherein the first switching operation is performed to transmit a signal output from the interface to the signal processor, and the second switching operation is performed to supply power to the signal processor.

3. The method as claimed in claim 1, wherein the first switching operation is performed to cut off a signal output from the interface from being transmitted to the signal processor, and the second switching operation is performed to cut off a supply of power to the signal processor.

4. The method as claimed in claim 1, wherein the signal output from the interface comprises a static electricity signal which is generated if there is a connection to the external device and an image signal which is input from the external device, wherein the first switching operation is performed to connect the static electricity signal output from the interface to ground and transmit the image signal to the signal processor.

5. The method as claimed in claim 4, wherein the static electricity signal comprises a static electricity shock and static electricity noise.

6. The method as claimed in claim 1, wherein the first switching operation is performed based on a determination of whether the image signal is input to the signal processor as a result of detecting a synchronization signal included in the image signal output from the interface.

7. An electronic device which displays an image signal, the electronic device comprising:

an interface which is communicably connected to an external device;

a signal processor which performs processes an image signal received from the external device through the interface;

a first switching unit which performs a switching operation to transmit a signal output from the interface to the signal processor or cut off the signal output from the interface from being transmitted to the signal processor; and a controller which controls the first switching unit based on an operation state of the electronic device.

8. The electronic device as claimed in claim 7, wherein the operation state of the electronic device comprises at least one of a state concerning whether the external device is connected to the interface, a power-on state of the electronic device, and a power-off state of the electronic device.

9. The electronic device as claimed in claim 7, wherein the controller controls the first switching unit to connect a signal output from the interface to ground and cut off a signal output from the interface from being transmitted to the signal processor.

10. The electronic device as claimed in claim 7, wherein the interface outputs at least one of a static electricity signal which is generated if there is a connection to the external device and an image signal which is input from the external device, wherein the controller controls the first switching unit to connect the static electricity signal output from the interface to ground and transmit the image signal to the signal processor.

11. The electronic device as claimed in claim 10, wherein the static electricity signal comprises a static electricity shock and static electricity noise.

12. The electronic device as claimed in claim 10, further comprising a second switching unit which supplies bias power to the signal processor or cuts off a supply of bias power to the signal processor, wherein the controller controls the second switching unit based on a switching state of the first switching unit.

13. The electronic device as claimed in claim 12, wherein, if the first switching unit the switching operation to transmit the signal output from the interface to the signal processor, the controller controls the second switching unit to supply the bias power to the signal processor.

14. The electronic device as claimed in claim 12, wherein, if the first switching unit performs a switching operation to cut off the signal output from the interface from being transmitted to the signal processor, the controller controls the second switching unit to cut off the supply of bias power to the signal processor, wherein the controller determines whether the image signal is input to the signal processor by detecting a synchronization signal included in the image signal output through the interface, and controls the second switching unit based on a result of the determination.

15. The electronic device as claimed in claim 10, wherein the interface outputs a first reference voltage if there is a connection to the external device, and outputs a second reference voltage if there is no connection to the external device, wherein the controller determines whether the external device is connected to the interface based on the first or second reference voltage output from the interface.

16. The electronic device as claimed in claim 10, wherein the electronic device is a digital television.

17. A method for removing a static electricity, the method comprising:

determining whether an interface is connected to an external device; and based on a result of the determining, performing a first switching operation to transmit a signal output from the interface to a signal processor or cut off the signal from being transmitted to the signal processor, wherein the signal output from the interface is a static electricity signal which is generated if there is a connection to the external device.

18. The method as claimed in claim 17, wherein the first switching operation is performed to connect a signal output from the interface to ground and cut off a signal output from the interface from being transmitted to the signal processor.

19. The method as claimed in claim 17, wherein the signal output from the interface is an image signal which is input from the external device, and wherein the first switching operation is performed to connect the static electricity signal output from the interface to ground and transmit the image signal to the signal processor.

20. The method as claimed in claim 18, further comprising, based on the first switching operation, performing a second switching operation to supply bias power to the signal processor or cut off a supply of the bias power to the signal processor.

21. The method as claimed in claim 20, wherein, if the first switching operation is performed to cut off the signal output from the interface from being transmitted to the signal processor, the second switching operation is performed to cut off the supply of the bias power to the signal processor, wherein, if the first switching operation is performed to transmit the signal output from the interface to the signal processor, the second switching operation is performed to supply the bias power the signal processor.

22. An electronic device comprising:

an interface which is communicably connected to an external device;

a signal processor which processes an image signal input from the external device through the interface;

a first switching unit which performs a switching operation to transmit a signal output from the interface to the signal processor or cut off the signal output from the interface from being transmitted to the signal processor;

a second switching unit which performs a switching operation to supply power to the signal processor or cut off a supply of power to the signal processor; and a controller which controls the second switching unit based on a switching state of the first switching unit.

23. The electronic device as claimed in claim 22, wherein, if the first switching element performs the switching operation to transmit a the output from the interface to the signal processor, the controller controls the second switching unit to supply power to the signal processor.

24. The electronic device as claimed in claim 22, wherein, if the first switching element performs a switching operation to cut off the signal output from the interface from being transmitted to the signal processor, the controller controls the second switching unit to cut off the supply of power to the signal processor.

25. The electronic device as claimed in claim 22, wherein the interface outputs at least one of a static electricity signal which is generated if there is a connection to the external device and an image signal which is input from the external device, wherein the controller controls the first switching element to connect the static electricity output from the interface to ground and transmit the image signal to the signal processor.

* * * * *